(12) United States Patent
Seshadri et al.

(10) Patent No.: US 7,417,888 B2
(45) Date of Patent: Aug. 26, 2008

(54) METHOD AND APPARATUS FOR RESETABLE MEMORY AND DESIGN APPROACH FOR SAME

(75) Inventors: Vijay K. Seshadri, San Jose, CA (US); Kenneth S. McElvain, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 275 days.

(21) Appl. No.: 11/184,294

(22) Filed: Jul. 18, 2005

(65) Prior Publication Data

US 2005/0254311 A1 Nov. 17, 2005

Related U.S. Application Data

(62) Division of application No. 10/804,878, filed on Mar. 18, 2004, now Pat. No. 6,934,183, which is a division of application No. 10/091,787, filed on Mar. 4, 2002, now Pat. No. 6,836,420.

(51) Int. Cl.
*G11C 7/00* (2006.01)
(52) U.S. Cl. ............. 365/154; 365/189.02; 365/189.03; 365/189.05; 365/189.08
(58) Field of Classification Search ................. 365/154, 365/189.02, 189.03, 189.05, 189.08
See application file for complete search history.

(56) References Cited

U.S. PATENT DOCUMENTS

| 5,018,111 | A | * | 5/1991 | Madland ...................... 365/233 |
| 5,067,110 | A | * | 11/1991 | Runaldue ................ 365/189.07 |
| 5,373,466 | A | * | 12/1994 | Landeta et al. .......... 365/189.01 |
| 5,450,353 | A | * | 9/1995 | Koike .......................... 365/154 |
| 5,678,021 | A | * | 10/1997 | Pawate et al. ............... 711/104 |
| 5,764,582 | A | * | 6/1998 | Tai .............................. 365/222 |
| 5,771,194 | A | * | 6/1998 | Maeno ........................ 365/200 |
| 5,831,868 | A | * | 11/1998 | Beausang et al. ............. 716/18 |
| 5,903,466 | A | * | 5/1999 | Beausang et al. ............. 716/18 |
| 6,067,627 | A | * | 5/2000 | Reents ........................ 713/324 |
| 6,119,211 | A | * | 9/2000 | Kaneko et al. .............. 711/166 |
| 6,282,127 | B1 | * | 8/2001 | Pang et al. ............. 365/189.02 |
| 6,289,498 | B1 | * | 9/2001 | Dupenloup ................... 716/18 |
| 6,292,931 | B1 | * | 9/2001 | Dupenloup ................... 716/18 |
| 6,295,636 | B1 | * | 9/2001 | Dupenloup ................... 716/18 |
| 6,298,472 | B1 | * | 10/2001 | Phillips et al. ................ 716/18 |
| 6,378,123 | B1 | * | 4/2002 | Dupenloup ................... 716/18 |
| 6,421,818 | B1 | * | 7/2002 | Dupenloup et al. ........... 716/18 |
| 6,442,721 | B2 | * | 8/2002 | Whetsel ...................... 714/726 |
| 6,463,560 | B1 | * | 10/2002 | Bhawmik et al. ........... 714/733 |
| 6,539,523 | B1 | * | 3/2003 | Narain et al. ................... 716/5 |

(Continued)

FOREIGN PATENT DOCUMENTS

JP 408153126 A * 6/1996

*Primary Examiner*—Viet Q Nguyen
(74) *Attorney, Agent, or Firm*—Blakely, Sokoloff, Taylor & Zafman LLP

(57) ABSTRACT

A resetable memory is described that includes a memory without reset capability having a data output coupled to a first input of a first multiplexer. A second input of the first multiplexer has a reset value input. A channel select for the first multiplexer is coupled to a resetable storage cell output that indicates whether a storage cell within the memory without reset capability has been written to after a reset or has not been written to after a reset.

4 Claims, 10 Drawing Sheets

U.S. PATENT DOCUMENTS

| | | | |
|---|---|---|---|
| 6,598,209 B1 * | 7/2003 | Sokolov | 716/4 |
| 6,609,229 B1 * | 8/2003 | Ly et al. | 716/4 |
| 6,611,462 B2 * | 8/2003 | Kawano | 365/185.23 |
| 6,694,452 B1 * | 2/2004 | Kitao | 714/23 |
| 6,731,106 B2 * | 5/2004 | Whetsel | 324/158.1 |
| 6,836,420 B1 * | 12/2004 | Seshadri et al. | 365/51 |
| 6,934,103 B2 * | 8/2005 | Chickanosky et al. | 360/51 |
| 6,934,183 B1 * | 8/2005 | Seshadri et al. | 365/154 |
| 7,174,489 B2 * | 2/2007 | Sadakata et al. | 714/719 |

* cited by examiner

```
module synReset(data_in, addr, reset, we, clk, data_out);

parameter data_width = 1024;
parameter addr_width = 10;
parameter RAMsize = 8;
parameter reset_value = 8'D0;

input [data_width-1:0] data_in;
input [addr_width-1:0] addr;
input reset, we, clk;
output [data_width-1:0] data_out;

integer i;
reg [data_width-1:0] mem [RAMsize-1:0];
wire [data_width-1:0] data_out;
//synthesis loop_limit 2000
always @(posedge clk)
begin
        if(reset == 1'b1)
        begin
                for (i=0; i < RAMsize ; i=i+1)
                        begin
                                mem[i] = reset_value;
                        end
        end else if(we == 1'b1)
        begin
                        mem[addr] = data_in;
        end
end
assign data_out = mem[addr];
endmodule
```

METHOD AND APPARATUS FOR RESETABLE MEMORY AND DESIGN APPROACH FOR SAME

This application is a divisional application of U.S. patent application Ser. No. 10/804,878, filed Mar. 18, 2004, now U.S. Pat. No. 6,934,183 which is a divisional application of U.S. patent application Ser. No. 10/091,787, filed Mar. 4, 2002 (now U.S. Pat. No. 6,836,420 B1).

FIELD OF THE INVENTION

The field of invention relates generally to electronic circuit design; and more specifically, to a method and apparatus for a resetable memory and a design approach for same.

BACKGROUND

FIG. 1 shows a memory unit 101. The memory unit 101 may be viewed as having a plurality of storage cells (or simply, "cells"). Associated with each cell is a unique address that provides access to the location of a particular storage cell. Each storage cell has the capacity to store "n" bits (where n is an integer greater than or equal to one). The n bits may be collectively referred to as a word of data.

Often, a memory unit 101 is written to by: 1) providing a word of data (i.e., "n" bits of data as seen in FIG. 1) to be written into the memory unit 101 on a data bus (such as input data bus 103 observed in FIG. 1); 2) providing an address (e.g., on address bus 102) that defines which storage cell will store the word of data; and 3) presenting a signal to the memory unit that effectively indicates the word of data on the data bus is to be written into the memory unit (such activating the write enable (WE) control line 104 of FIG. 1). Alternatively, the write could be time based as in a shift register, or it could be a mix of address and time based write.

Often, a memory unit 101 is read from by: 1) providing an address (e.g., on address bus 102) that defines which cell a word of data will be read from; and 2) presenting a signal to the memory unit that effectively indicates a word of data is to be read from the memory unit (such as activating the read enable (RE) control line 130 of FIG. 1). The word of data is presented at the data output bus 106. In embodiments alternative to that observed in FIG. 1, the data in and data out buses 103, 106 may be combined to form a bi-directional bus. Also, in various alternate embodiments, one of the enable lines 104, 130 may be eliminated so that a single line is used to toggle the memory unit between being in a writable state and being in a readable state. Alternatively, it could be time based as in a shift register, or a mix of address and time based read. A commercial example that uses a mix of address and time based read/write is the Xilinx Virtex SRL primitive that is written into like a shift register and is read from like a RAM.

The memory unit 101 of FIG. 1 can be used to implement a number of storage related devices such as a random access memory (RAM), a first-in-first-out (FIFO) queue (e.g., by appropriately controlling the address values of the memory unit 101 such that a FIFO queue is emulated with the memory unit 101), a content addressable memory (CAM), a shift register, etc. A problem with memory units (as they are offered to designers who wish to employ them in their circuit designs), however, is that they do not have a reset function. A reset function effectively "clears" the memory unit's cell word values to some "reset" value (e.g., a n wide value of "0"); and, often, the integration of circuitry for resetting the cell word values of the memory unit 101 is too expensive and/or complicated to implement. For example, according to one approach, in order to implement a resetable memory, each n wide storage cell is implemented with resetable flip-flops that are individually accessed via complicated multiplexing and control circuitry. Here, the use of resetable flip-flops to implement each n wide storage cell (as well as the complicated multiplexing and control circuitry) can result in a resetable memory unit having noticeably slower performance (and that consumes more silicon surface area) than a memory unit that does not have resetable storage cells.

SUMMARY OF THE INVENTION

An apparatus is described that includes a memory without reset capability having a data output coupled to a first input of a first multiplexer. A second input of the first multiplexer has a reset value input. A channel select for the first multiplexer is coupled to a resetable storage cell output that indicates whether a storage cell within the memory without reset capability has been written to after a reset or has not been written to after a reset.

BRIEF DESCRIPTION OF THE DRAWINGS

FIG. 2c shows an embodiment of a register transfer level (RTL) description that may be used to describe the resetable memory of FIG. 2a.

DETAILED DESCRIPTION

A resetable memory is described that includes a memory without reset capability having a data output coupled to a first input of a first multiplexer. A second input of the first multiplexer has a reset value input. A channel select for the first multiplexer is coupled to a resetable storage cell output that indicates whether a storage cell within the memory without reset capability has been written to after a reset or has not been written to after a reset. Other methods and apparatus are also described.

Resetable Memory Unit Embodiment(s)

Figure 2A:
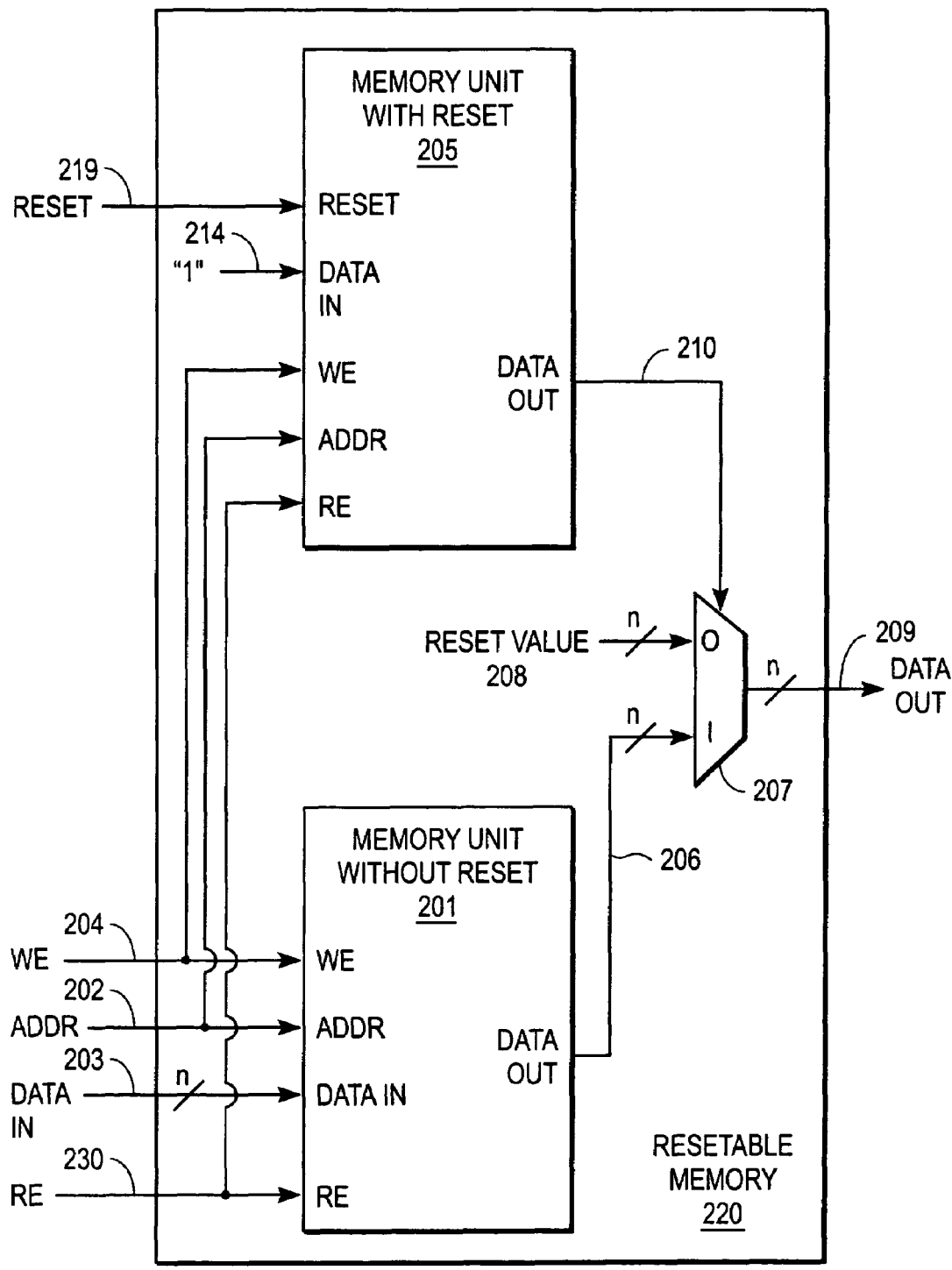
FIG. 2a shows an embodiment of a resetable memory that is constructed with a memory unit that does not have a reset function.

FIG. 2a shows an embodiment of a resetable memory 220 that is constructed with a memory unit 201 that does not have a reset function. The memory unit without reset 201 of FIG.

Figure 1:
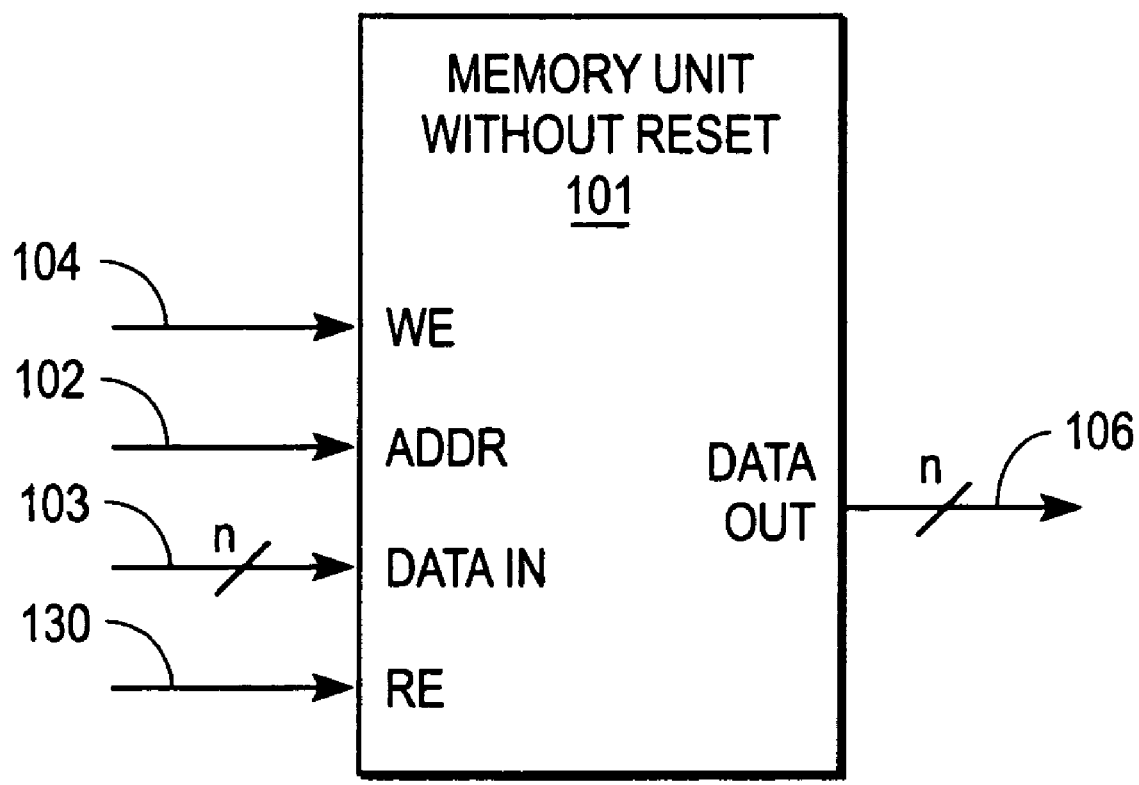
FIG. 1 shows a memory unit.

2*a* can be viewed as corresponding to the memory unit without reset 101 that was originally described in FIG. 1. The resetable memory 220 of FIG. 2*a* includes both a memory without reset 201 (as described above) as well as a memory unit 205 that includes a reset function (i.e., a memory unit 205 with reset).

In various embodiments, the data width of the memory unit with reset 205 is "smaller" than the data width of the memory unit without reset 201. That is, in various approaches, the cell word size of the memory unit with reset 205 is less than the cell word size of the memory cell without reset 201. In a further embodiment, the cell word size of the memory unit with reset 205 is one bit wide (i.e., such that its output line 210 carries only two states "1" or "0").

As elaborated on in more detail below, the smaller memory with reset 205 cost effectively disguises the inability of the larger memory 201 to reset its cells. That is, the cooperative integration of the "smaller" memory with reset 205 and the "larger" memory with reset 201 allows the larger memory without reset 201 to appear (e.g., to downstream circuitry from data output 209) "as if" it has a reset function; yet, the complexities/costs associated with integrating a reset function into the larger memory without reset 201 are avoided. As a result, an overall resetable memory 220 is constructed from the pair of memories 201, 205 that has a reset function, yet is less expensive/complex than a memory unit of comparable storage capacity.

The resetable memory unit 220 may be viewed as having a memory unit data output 209 and an actual memory unit data output 206. The actual memory unit data output 206 corresponds to the memory unit data output 106 described in FIG. 1. That is, for any read operation, the data word stored in the cell being addressed of the memory unit without reset 201 is observed at the actual memory unit data output 206.

The memory unit data output 209 is the "effective" memory unit output as observed by the downstream circuitry that may use the data that is read from the resetable memory 220. A multiplexer 207 is positioned between the memory unit data output 209 and the actual memory unit data output 206. A first multiplexer 207 input receives the actual memory unit data output 206. A second multiplexer 207 input receives a reset value 208.

The multiplexer 207 is configured to present at the memory unit data output 209: 1) the reset value 208 if the resetable memory unit 220 cell being addressed during a read operation has not been written to since its last "reset"; and 2) the data word read from the memory unit 201 (as provided on the actual memory unit data output 206) if the resetable memory unit 220 cell being addressed during the read operation has been written to since its last "reset". In this manner, the memory unit output 209 presents data consistent with the operation of a memory unit having the ability to reset the data words that it stores.

That is, after the resetable memory 220 has been "reset", any attempt to read a data word from a particular cell within the memory unit without reset 201 will produce the reset value 208 at the memory unit data output 209. This functional behavior continues for each cell until a particular cell is written to. After a particular cell is written to, the newly written data is presented at the memory unit data output 209 until the next reset of the resetable memory 220 occurs. The multiplexer 207 and memory unit with reset 205 may be viewed as providing for the emulation of a reset function for the memory unit without reset 201 reset.

In an embodiment where the data output 210 of the memory unit with reset 205 (which feeds the channel select input of multiplexer 207) is one bit wide, the data output 210 effectively acts a state bit that signifies whether the resetable memory 220 cell being read from has been: 1) not written to since a last resetable memory 220 reset; or 2) has been written to since a last resetable memory 220 reset. Note that in the particular embodiment of FIG. 2*a* a "0" is used to signify the former and a "1" is used to signify the later.

The memory unit with reset 205 acts a storage resource that keeps a record, for each cell within the memory unit without reset 201, as to whether or not the particular cell has been written to after a reset of the resetable memory 220. The reset input of the memory unit with reset 205 acts as the reset input 219 for the resetable memory 220. When the reset 219 is active, each cell within the memory unit with reset is cleared (e.g., is given a value of "0"). Noting that the Write Enable 204, Address 202, and Read Enable 230 lines of both memory units 201, 205 are tied together, any attempt to read a particular cell within the memory unit without reset 201 causes a simultaneous read from the memory unit with reset 205 at its corresponding cell.

Figure 2B:
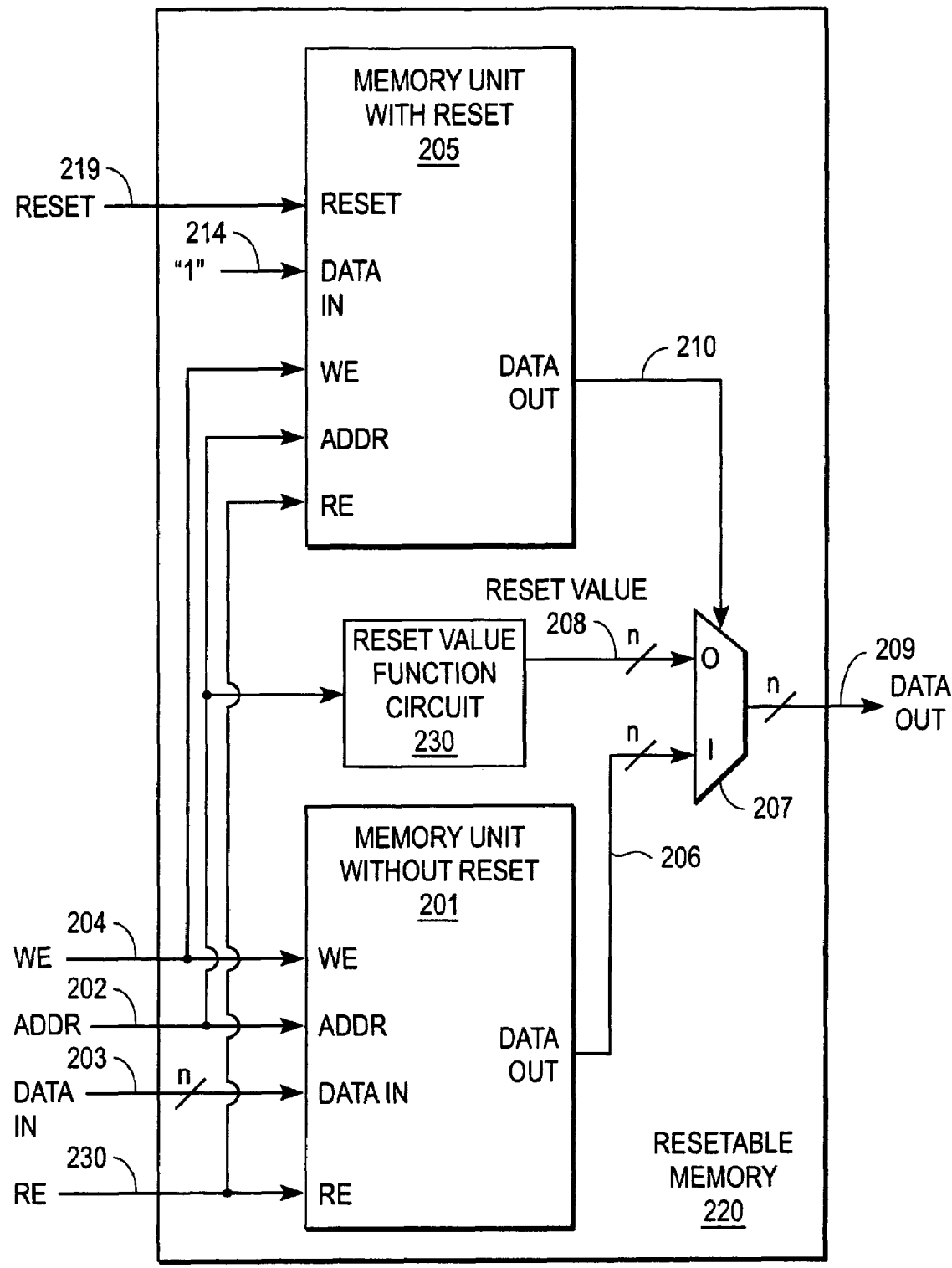
FIG. 2b shows another embodiment of a resetable memory that is constructed with a memory unit that does not have a reset function.

Thus, if an attempt is made to read a cell after a reset (and before any writing to the cell has occurred), the reset output value of the memory unit with reset 205 (e.g., a "0") will be presented to the multiplexer's 207 channel select input. According to the embodiment of FIG. 2, a channel select value of "0" causes the reset value 208 to be presented at the resetable memory output 209. As such, the resetable memory output 209 properly reflects a reset value for a cell that has not been written to after a reset has been applied.

Similarly, any attempt to write to a particular cell within the memory unit without reset 201 causes a simultaneous write into the memory unit with reset 205 at its corresponding cell. Noting that the data input 214 of the memory unit with reset 205 is tied to a "1" in the embodiment of FIG. 2, the first writing to a particular cell within the memory unit without reset 201 will cause the corresponding cell within the memory unit with reset 205 to have its reset value (of "0") to be written over (with a value of "1").

Thus, subsequently, if an attempt is made to read the same cell before a next a reset occurs, an output value of "1" will be presented from output 210 of the memory unit with reset 205 to the multiplexer's 207 channel select input. According to the embodiment of FIG. 2, a channel select value of "1" causes the actual memory unit without reset output 206 to be presented at the resetable memory output 209. As such, the resetable memory output 209 properly reflects the most recently written cell value for those cells that have been written to after a reset has been applied.

In this manner, the circuit of FIG. 2*a* emulates the behavior of a memory unit having the storage capacity of memory unit 201 but also having reset capability. For each cell within the memory unit without reset 201, once the resetable memory 220 is reset, the reset value 208 should be observed for all subsequent read operations until the cell is written to. After the cell is written to, the value of the most recent written data should be observed until the next reset of the resetable memory 220 occurs.

Figure 3:
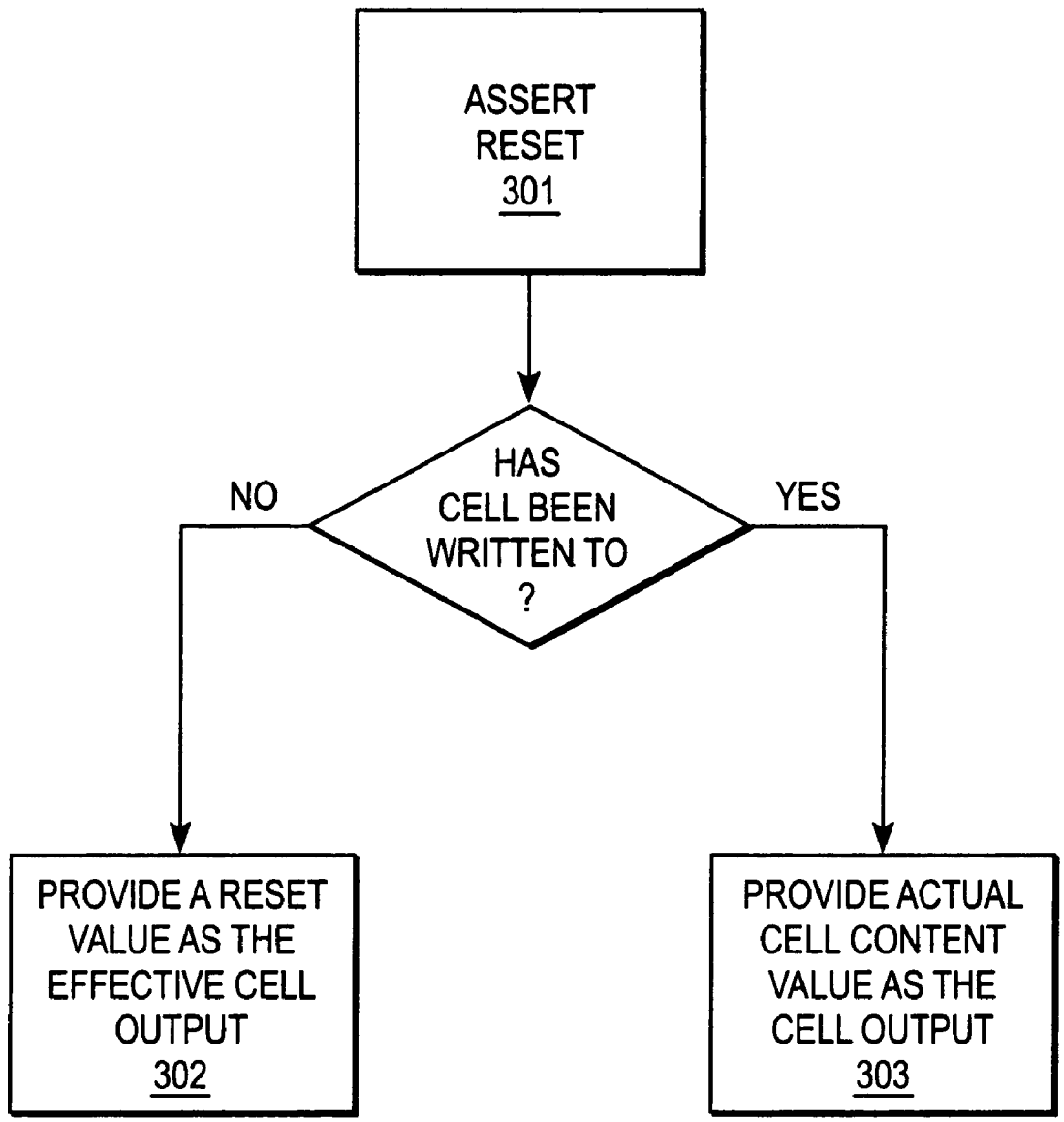
FIG. 3 shows an embodiment of a methodology that can be executed by the resetable memory of FIG. 2.

FIG. 3 shows a methodology that reviews the approaches discussed above. First, a reset is asserted 301. This causes the reset value 208 to be provided 302 as the effective memory cell output—until the cell has been written to. If the cell has been written to, the actual value of the cell contents as stored within the memory unit without reset 201 are presented 303 as the output.

Before continuing note that the particular embodiment of FIG. 2*a* indicates that the same reset value 208 is used for each resetable memory 220 cell. In alternate embodiments, different reset values may be used for various groupings of cells (or individual cells themselves). For example, referring to FIG. 2b a reset value function circuit 230 may be inserted between (and coupled to) the reset value 208 input of the multiplexer 207 and the address input 202 of the resetable memory 220. The circuit 230 may be designed to issue different reset values, depending on the particular addressing value that appears on the address input 202.

Automatic Inference and Implementation of Memory with Selective Reset

A further utility of the approaches discussed above is the ease at which a memory having reset may be incorporated into a designer's circuit design—even if the underlying semiconductor technology does not easily provide for a memory core having selective reset. For example, semiconductor circuits are typically designed with a particular semiconductor manufacturing process (i.e., a "foundry") in mind. Usually, the foundry supplies models of basic building blocks (e.g., logic gates, memory units, etc.) from which a semiconductor chip design can be constructed.

The resetable memory approach discussed above may be used to effectively provide a designer with a resetable memory, even though the foundry only manufactures traditional memory units without reset (such as the traditional memory unit discussed with respect to FIG. 1); or, offers resetable memories that are too cumbersome to implement as a large memory. For example, in one embodiment, a software design tool may be configured to offer the insertion of a resetable memory (such as that described above in FIG. 2) into a designer's design. If the designer decides to incorporate a resetable memory into his or her design, the resetable memory is automatically "built into" the designer's design.

In one embodiment, the use of a resetable memory is automatically inferred from the behavioral level or RTL level description of the designer's design; and, in response, a resetable memory is automatically inserted into the circuit designer's design. A behavioral level or RTL level description is a circuit description that is tailored to be understood by a computer and that describes the circuit in terms of its methodology (e.g., the various processes performed by the circuit and the relationship(s) between them) as opposed to describing the circuit only in terms of its hardware components and the interconnections between them (e.g., gates, registers, signal lines, etc.).

Given that behavioral or RTL level descriptions are written in terms of methodologies to be understood by a computer, they are frequently documented in a form that is similar to a software program or a pseudo code description of the operational flow of the circuit. As an example, FIG. 2c provides an embodiment of an RTL level description that can be used to describe the resetable memory of FIG. 2a. In order to automatically "install" a resetable memory into a circuit designer's design, a software design tool can be configured to automatically infer the use a resetable memory from a behavioral level or RTL level description by identifying from the operational flow of the circuit description that a reset condition is being individually applied to one or more variables (e,g., that is to be implemented in hardware as a data word that resides within some type of storage cell).

Furthermore, in response to the inferred use of a resetable memory, the software tool may be further designed to automatically install (or present the designer with an offer to automatically install) a resetable memory into the designer's circuit. In one embodiment, the resetable memory 220 is incorporated into the designer's circuit at the gate level. Typically, an RTL level description of a circuit is compiled into a gate level netlist that describes the specific digital structures used in the design and the interconnections between them. Thus, upon recognition of a reset condition within the behavioral level or RTL level description of the circuit, the compilation result into its corresponding gate level form is modified by the design tool so as to incorporate the resetable memory.

In a further embodiment, if a memory unit with reset is offered by the applicable foundry, the foundry offering is incorporated into the resetable memory as the memory unit with reset 205. Further still, the design tool may be configured with its own design library that includes a memory with reset 205 that can be configured from a foundry's standard logic offerings. As result, the resetable memory 220 can be constructed even for those foundries that do not offer a memory with reset in their standard offerings. An embodiment of a gate level memory with reset that can be constructed from standard logic is provided in more detail ahead.

Figure 4:
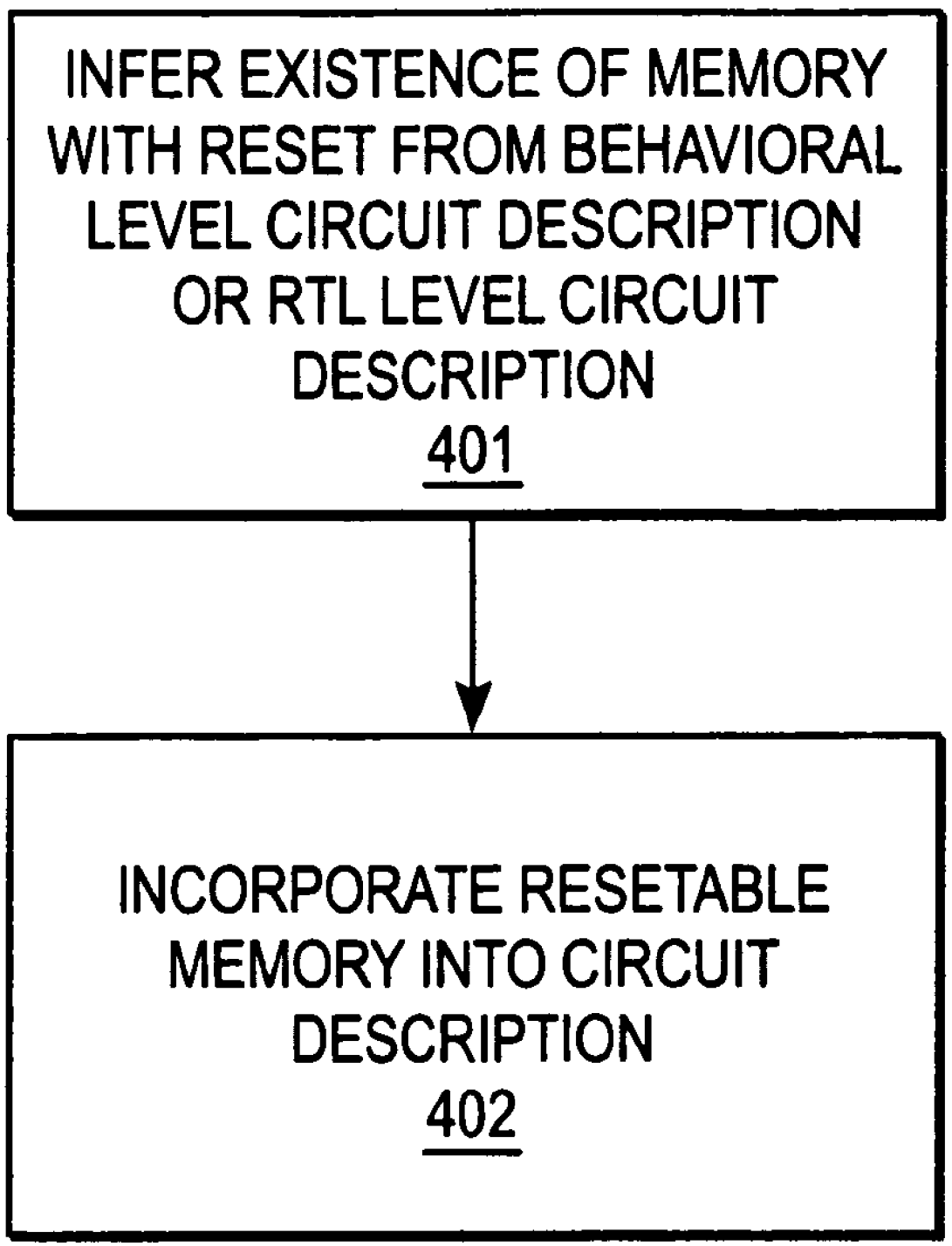
FIG. 4 shows a design methodology that automatically incorporates a resetable memory that is constructed with a memory that does not have a reset function into a semiconductor chip design.

FIG. 4 shows a methodology that reviews such a design flow sequence. First, the use of a resetable memory is automatically inferred 401 from the designer's behavioral or RTL level description. The automatic inference can be accomplished, for example, by configuring the design tool to recognize from the operational flow of the circuit that: 1) some type of reset is being applied to the stored data values within the circuit; and 2) the stored data values are being changed to some type of reset value in response. After the use of a resetable memory has been inferred 401, a resetable memory is incorporated into the designer's design (e.g., at the gate level as described just above).

Note therefore that embodiments of the present approach (as well as those discussed further ahead) may be implemented not only within a semiconductor chip but also within machine-readable media. For example, the designs discussed above may be stored upon and/or embedded within machine readable media associated with a design tool used for designing semiconductor devices. Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

Resetable Memory with Gate Level Design for Memory Unit with Reset

Figure 5:
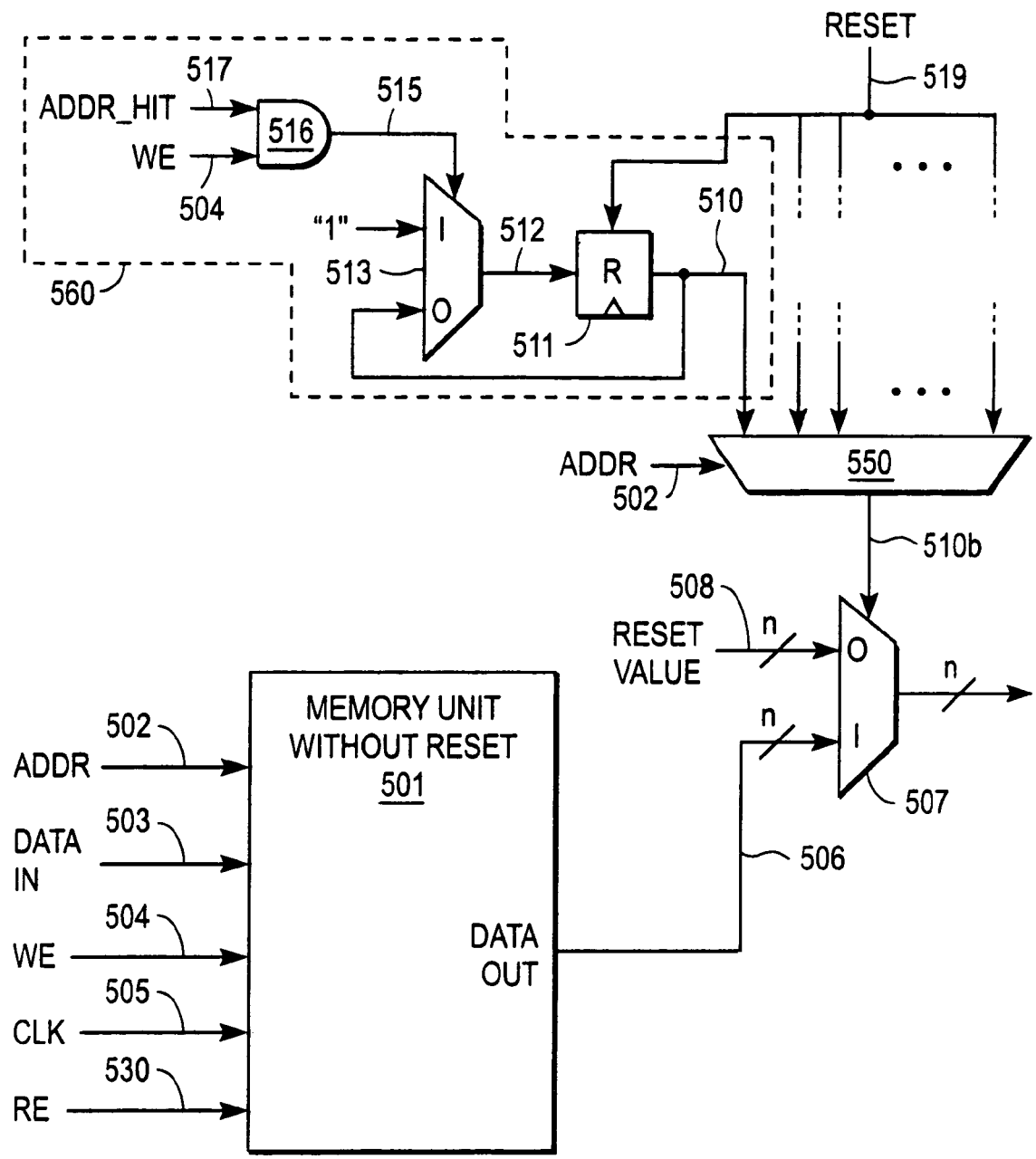
FIG. 5 shows another embodiment of a resetable memory that is constructed with a memory unit that does not have a reset function.

FIG. 5 relates to resetable memory design embodiment that can use standard foundry logic to create a memory unit with reset. As such, the design of FIG. 5 can be used even if the underlying foundry does not provide a memory with reset in its standard design library. According to the design embodiment of FIG. 5, a resetable register 511 is used as a storage cell for the memory unit with reset. Here, the register 511 holds the value of a state bit that controls the channel select of the multiplexer 507 for its corresponding cell.

The register 511 also has a reset input 519 used to effectively reset the storage cell. When a reset signal is presented to the register 511, the state bit from the register output is set to a "0". As such, the channel select line 510 of the multiplexer 507 is positioned to enable the reset value input 508 of the multiplexer 507. According to the design approach of FIG. 5, the register 511 output is coupled in a feedback arrangement to an input of a second multiplexer 513. The other input 514 of the second multiplexer 513 corresponds to a logical value that is opposite that of the register 511 reset value. That is, because the register 511 reset value is "0" in the embodiment of FIG. 2, a "1" is provided to the input 514 of the second multiplexer 513.

Note that, after a reset, the feedback input to the second multiplexer 513 will be a "0" because the register 511 reset value is "0". The second multiplexer 513 is configured to transition from the enablement of the feedback input to the enablement of the "1" input 514 when the memory unit cell is first written to after a reset. That is, for as long as the memory unit cell is not written to after a reset (i.e., is either reset again, read from or not used at all), the write enable (WE) line 504 and ADDR_HIT line 517 remain at a logic "0".

As such, during this time period, the value of the channel select line 515 for the second multiplexer 513 is a logic "0". This corresponds to the register 511 being continuously latched with its reset output value of "0". As described above, this further corresponds to the channel select line 510 of the first multiplexer 507 being positioned to enable the reset value input 508 of the multiplexer 507. In the embodiment of FIG. 5, the WE line 504 is a logic "1" only if a write operation occurs; and, the ADDR_HIT line 517 is a logic "1" only if the address corresponding to the memory unit without reset 501 cell represented by register 511 appears at the address input 502.

As such, the output 515 of the AND gate 516 is a logic "1" only if the memory unit without reset 501 cell represented by register 511 is being written to. When this occurs, the "1" input 514 to the second multiplexer 513 is enabled, and a "1" is latched into the register 511. Thus, due to the feedback input of the second multiplexer, a "1" is continuously latched into the register 511 after the first write operation is performed upon the memory unit cell (after it has been a reset); and, a "0" does not appear at the register 511 output until it is next reset.

This corresponds to the actual memory unit data output 506 being enabled by the first multiplexer 507 after the memory unit cell is first written to (after it has been reset). The actual memory unit data output 506 is then enabled until the memory unit cell is reset again. Before continuing, note that the ADDR_HIT 517 may be provided by a logic circuit (not shown in FIG. 5 for simplicity) that effectively decodes the address input 502 value.

For simplicity only one register 511 is shown in FIG. 5. However, it should be understood that each of the various inputs of multiplexer 550 may be coupled to its own register and corresponding circuit. That is, for example, the circuitry outlined by region 560 may be repeated at each multiplexer 550 input to provide reset capability for a plurality of cells. Note that the ADDR_HIT input 517 associated with each repeated circuit should register a logical "1" only when the particular memory unit cell that the circuit applies to is accessed.

The third multiplexer 550 collects each register output. During a memory read from a memory unit cell having selective reset capability, the address of the memory unit cell to be read is used as an input to the third multiplexer 550 so that the reset state bit from the appropriate register (i.e., the register that corresponds to the memory unit cell being read from) is delivered to the first multiplexer 507. As such, the channel select 510b of the first multiplexer is controlled on a "per cell" basis.

First Alternate Embodiment of Resetable Memory

Figure 6:
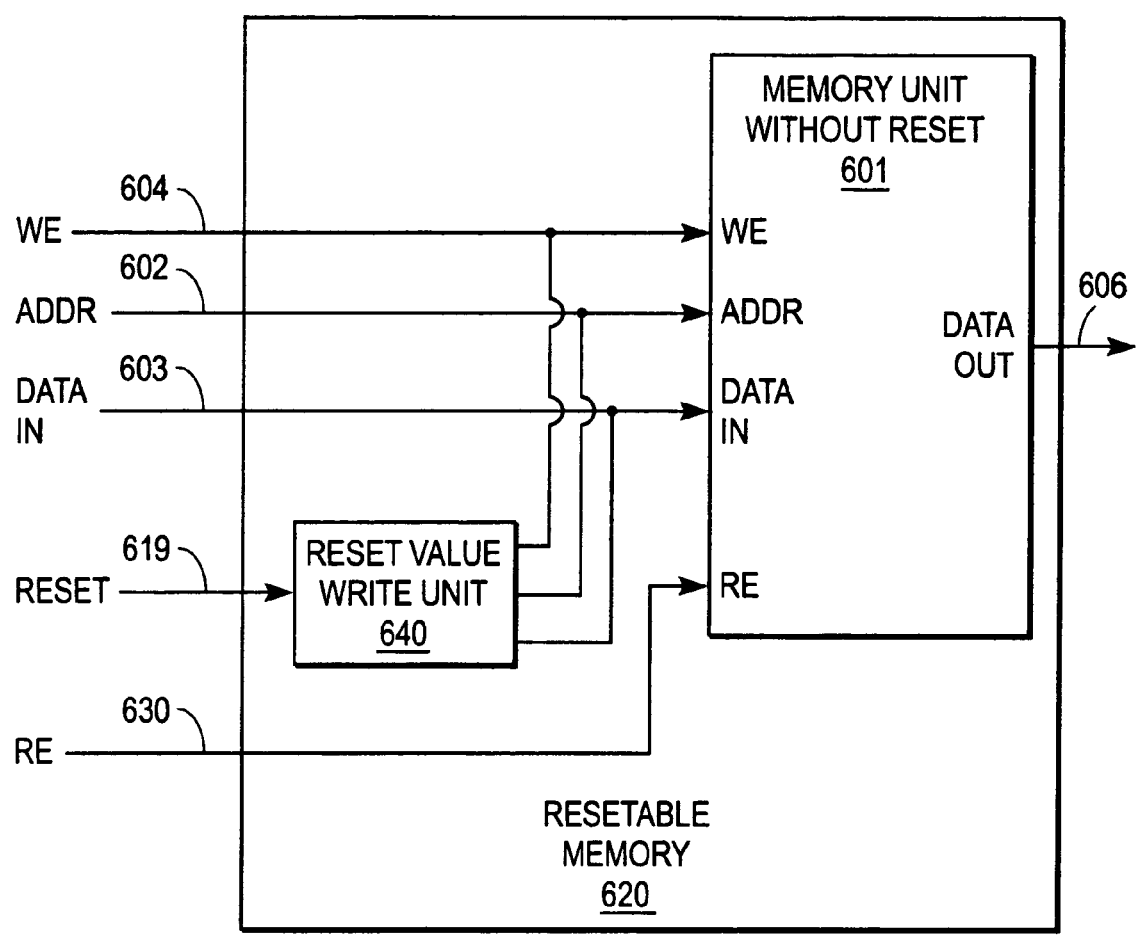
FIG. 6 shows another embodiment of a resetable memory that is constructed with a memory unit that does not have a reset function.

FIG. 6 shows another resetable memory embodiment 620. The resetable memory 620 of FIG. 6 includes a memory unit without reset 601 and a reset value write unit 640 and reset input 619 that are coupled to the write enable 604, address 602 and data input 603 of the memory unit without reset 601. According to one approach, in response to an active reset being applied at the reset input 619, the reset value write unit 640 writes a reset value into each cell of the memory unit without reset 601. Thus, similar to the approaches described above, the memory unit without reset 601 "appears" to circuitry downstream from output 606 "as if" it is resetable.

Because an extended amount of time may be consumed by the reset value write unit 640 in the writing of a reset value into a number of memory unit without reset 601 cells, the resetable memory embodiment 620 of FIG. 6 is most appropriate in those environments where a write operation to the memory unit without reset 601 does not occur for an extended period of time after the reset input 619 is activated. As such the write enable input 604, the address input 602 and the data input 603 are sufficiently free to accept the input signals provided by the reset value write unit 640 (while reset values are being written into the memory unit without reset 601) without interruption from sources outside the resetable memory 620. The reset value write unit 640 may be designed, as just one embodiment, to repeatedly: 1) increment a prior address value so as to form a current address value; and, 2) write a reset value at the current address value.

Here, an appropriate environment for the type of resetable memory 620 observed in FIG. 6 can be determined from an analysis of the number of available clock cycles that may be used to execute a reset. As clock cycles can be inferred from within a behavioral or RTL level environment, the above described analysis can be performed at the behavioral level or RTL level as well. Generally, the more clock cycles that may be consumed in executing a reset, the more likely it is that the approach of FIG. 6 can be successfully implemented.

As such, a design tool may be configured to not only infer the use of a resetable memory from a behavioral or RTL level description, but may also be configured to infer the number available of clock cycles for executing a reset to one or more variables. This may be accomplished, for example, by estimating or calculating the time (e.g., by counting the number of clock cycles) between the moment a reset is issued to a particular variable; and, the earliest moment when the reset variable could be subsequently needed by the operational flow of the circuit.

Figure 7:
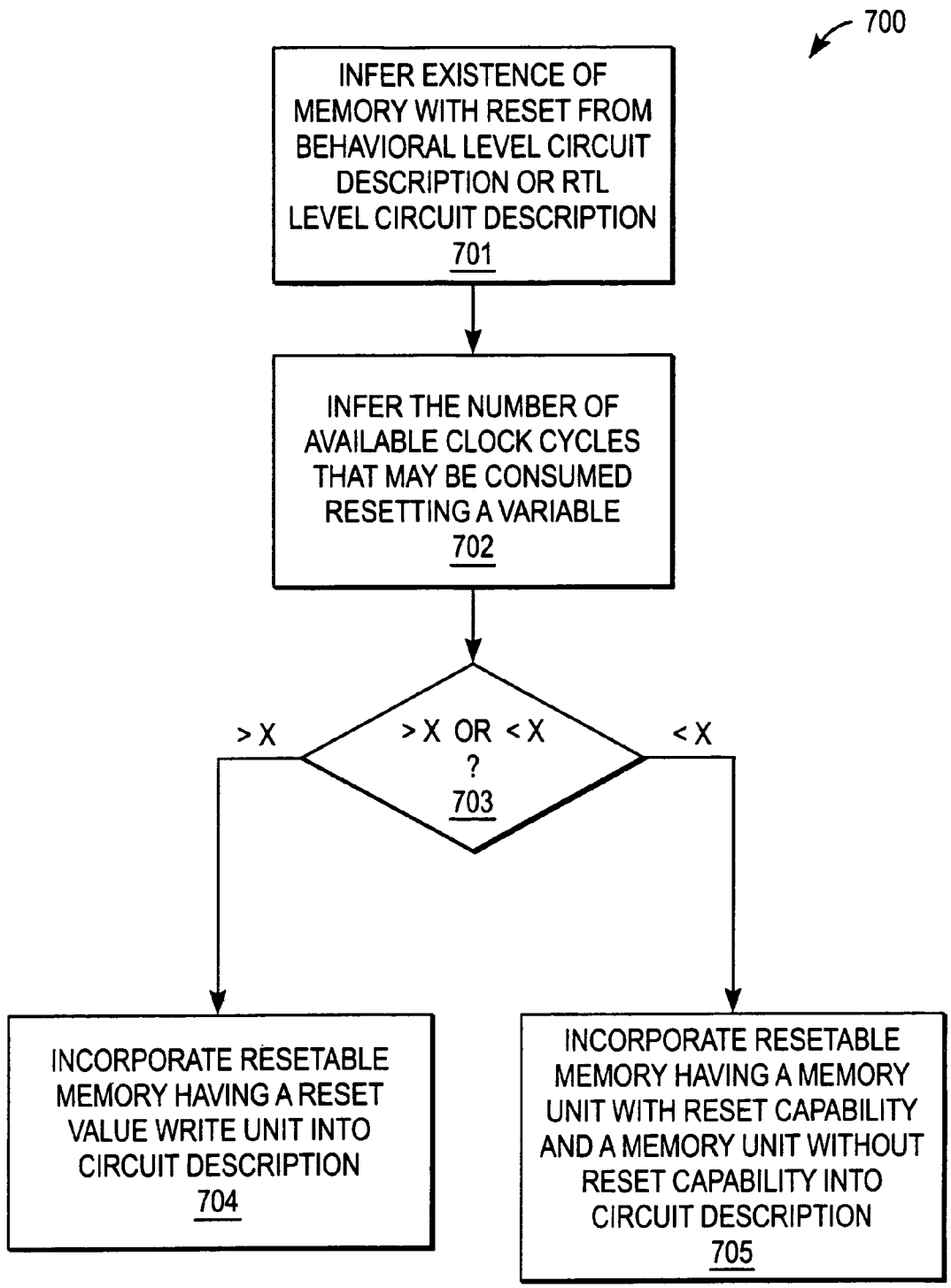
FIG. 7 shows an embodiment of a methodology that may be used to automatically install a resetable memory having a reset value write unit as observed in FIG. 6.

Furthermore, a determination as to the amount of time that is available to implement a reset may be used to drive which particular type of resetable memory (e.g., a resetable memory 220 having a memory unit with reset 205 as observed in FIG. 2a; or, a resetable memory 620 having a reset value write unit 640 as observed in FIG. 6) is to be automatically installed by a software design tool. FIG. 7 shows an embodiment of a methodology that describes such an approach in more detail. Here, as in the methodology of FIG. 4, the existence of a resetable memory is inferred 701 from the operational flow of a behavioral or RTL level circuit description.

Then, the number of available of clock cycles available for implementing a reset are inferred 702. Here, if the number of clock cycles is small enough so as to be less than a threshold value "X" (which, in turn, corresponds to the amount of time consumed by the reset value write unit 640) then the use of a resetable memory having a reset value write unit 640 is deemphasized (because the reset value write unit 640 may need more time to execute the reset than the circuit can wait to use the reset value). As such, a resetable memory having a memory unit with reset and a memory unit without (e.g., as observed in FIG. 2a) is automatically installed 705. By contrast, if the number of clock cycles is large enough so as to be greater than the threshold value "X" then the use of a resetable memory having a reset value write unit 640 is emphasized (because the reset value write unit 640 has a sufficient amount of time to execute a reset). As such, a resetable memory having a reset value write unit 640 (e.g., as observed in FIG. 6) is automatically installed 704. Here, often, the approach of FIG. 6 consumes less semiconductor chip surface area than the approach of FIG. 2a; and, as such, in an effort to efficiently consume semiconductor surface area, the methodology of FIG. 7 installs the approach of FIG. 2a only if the approach of FIG. 6 is deemed to be unfeasible.

Figure 8:
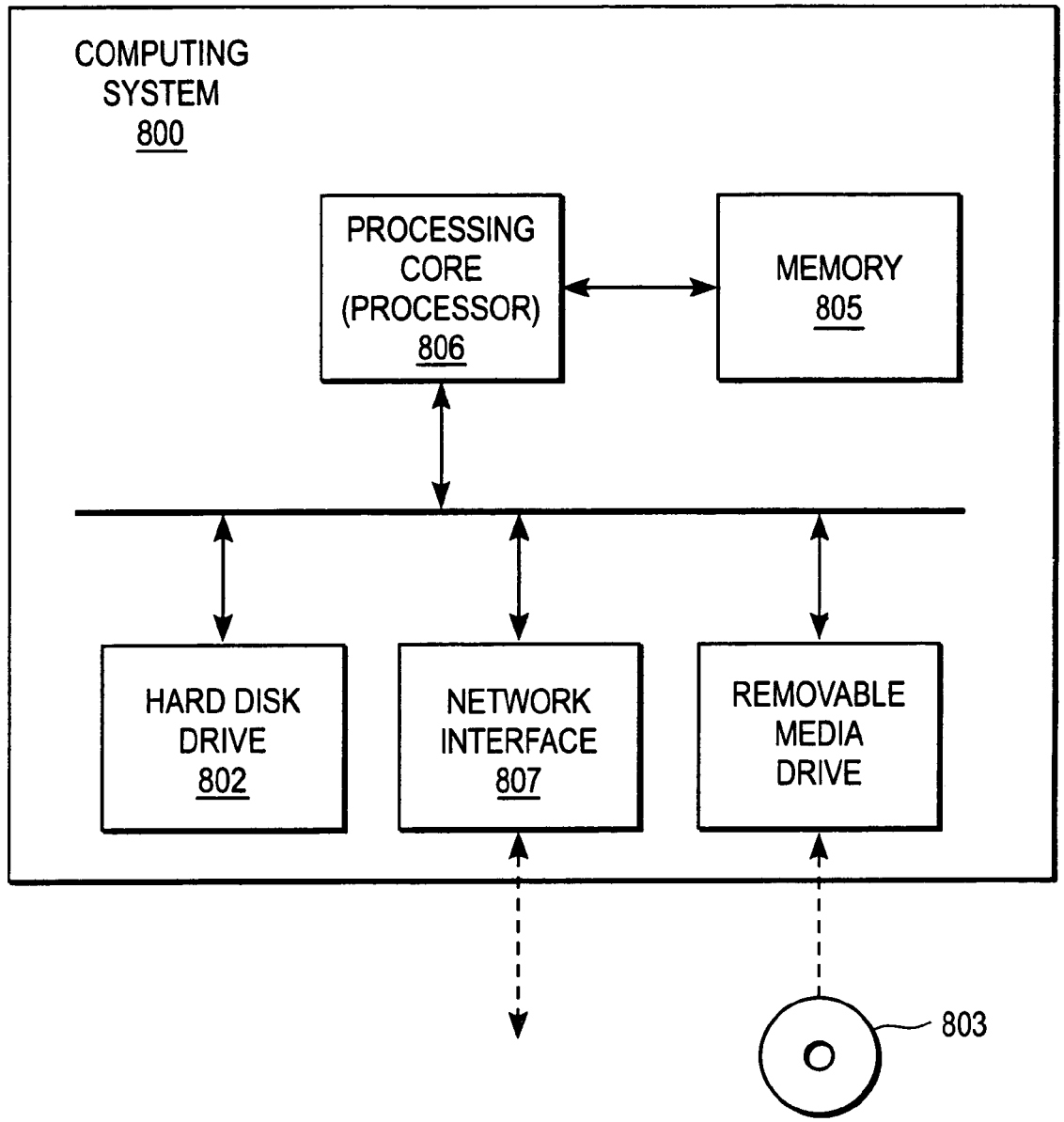
FIG. 8 shows an embodiment of a computing system.

FIG. 8 shows an embodiment of a computing system 800 that can execute instructions residing on a machine readable medium (noting that other (e.g., more elaborate) computing system embodiments are possible). The instructions may be related to integrated circuit design (e.g., as described in FIGS. 2a through 7). In one embodiment, the machine readable medium may be a fixed medium such as a hard disk drive 802. In other embodiments, the machine readable medium may be movable such as a CD ROM 803, a compact disc, a magnetic tape, etc. The instructions (or portions thereof) that are stored on the machine readable medium are loaded into memory (e.g., a Random Access Memory (RAM)) 805; and, the processing core 806 then executes the instructions. The instructions may also be received through a network interface 807 prior to their being loaded into memory 805.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:

presenting a reset value as a read value from a storage cell of a memory unit without reset if said storage cell has not been written to after a reset has been applied, said reset value not an actual output value of said memory unit without reset; and presenting said actual output value of said memory unit without reset as said read value if said storage cell has been written to after said reset has been applied and before a following reset has been applied.

2. The method of claim 1 further comprising reading a value from a resetable storage cell that indicates whether said storage cell has been written to after a reset has been applied.

3. The method of claim 2 wherein said resetable storage cell is a storage cell within a memory having reset capability, said resetable storage cell having the same address as said storage cell.

4. The method of claim 2 wherein said resetable storage cell is a register.

* * * * *